United States Patent
Cheim et al.

(10) Patent No.: US 12,163,896 B2
(45) Date of Patent: Dec. 10, 2024

(54) DEVICE AND METHOD FOR TRANSFORMER IN-SITU INSPECTION

(71) Applicant: HITACHI ENERGY LTD, Zürich (CH)

(72) Inventors: Luiz V. Cheim, St. Charles, MO (US); George Zhang, Windsor, CT (US); Thomas Fuhlbrigge, Ellington, CT (US); Harald Staab, Bavaria (DE); William Eakins, Bloomfield, CT (US); Gregory F. Rossano, Enfield, CT (US); Biao Zhang, West Hartford, CT (US); Poorvi Patel, Ballwin, MO (US); Marek Budyn, Cracow (PL)

(73) Assignee: HITACHI ENERGY LTD, Zürich (CH)

( * ) Notice: Subject to any disclaimer, the term of this patent is extended or adjusted under 35 U.S.C. 154(b) by 706 days.

(21) Appl. No.: 14/762,985

(22) PCT Filed: Jan. 24, 2014

(86) PCT No.: PCT/US2014/012920
§ 371 (c)(1),
(2) Date: Jul. 23, 2015

(87) PCT Pub. No.: WO2014/120568
PCT Pub. Date: Aug. 7, 2014

(65) Prior Publication Data
US 2015/0369751 A1    Dec. 24, 2015

(30) Foreign Application Priority Data
Feb. 1, 2013    (EP) ..................................... 13153721

(51) Int. Cl.
*G01M 3/38*    (2006.01)
*B63G 8/00*    (2006.01)
(Continued)

(52) U.S. Cl.
CPC ........... *G01N 21/8851* (2013.01); *B63G 8/16* (2013.01); *G01M 3/38* (2013.01); *G01N 21/9009* (2013.01);
(Continued)

(58) Field of Classification Search
CPC ........... G01N 21/8851; G01N 21/9072; G01N 2201/0218; G05D 1/0044; B63G 8/16; B63G 2008/005
See application file for complete search history.

(56) References Cited

U.S. PATENT DOCUMENTS 2,330,674 A * 9/1943 Briggs ..................... B63G 8/16
114/151
3,694,094 A 9/1972 Low et al. ..................... 356/241
(Continued)

FOREIGN PATENT DOCUMENTS

JP    61-033371 A    2/1986    ............. B62D 57/02
JP    H07 27786 U    5/1995
(Continued)

OTHER PUBLICATIONS

International Search Report mailed May 19, 2014 in corresponding application No. PCT/US2014/012920.
(Continued)

*Primary Examiner* — Matthew G Marini
(74) *Attorney, Agent, or Firm* — Sage Patent Group (57) ABSTRACT

An inspection device for use in a fluid container having at least an opening includes a housing sized to fit through the opening. The housing has at least two fluid flow channels extending therethrough, each having an inlet and an outlet, and a pump maintained in the housing within each fluid flow channel. The pumps are selectively controlled to maneuver the housing within the fluid container. The inspection device continues with a method of in-situ inspection of a container
(Continued)

having at least one opening to receive a fluid, that includes up-loading a virtual model of the container into a computer, inserting the device into the container, generating a position signal by the device and receiving the position signal on a computer. A virtual image of the device in the virtual model of the container is generated to determine an actual position of the device within the container.

19 Claims, 6 Drawing Sheets (51) Int. Cl.
*B63G 8/16* (2006.01)
*G01N 21/88* (2006.01)
*G01N 21/90* (2006.01)
*G01N 21/95* (2006.01)
*G01R 31/62* (2020.01)
*G05D 1/00* (2024.01)
*G21C 17/013* (2006.01)

(52) U.S. Cl.
CPC ......... *G01N 21/9072* (2013.01); *G01N 21/95* (2013.01); *G01R 31/62* (2020.01); *G05D 1/0044* (2013.01); *G21C 17/013* (2013.01); *B63G 2008/005* (2013.01); *G01N 2201/02* (2013.01)

(56) References Cited

U.S. PATENT DOCUMENTS

| | | | | |
|---|---|---|---|---|
| 4,315,476 | A * | 2/1982 | van der Tak | B63H 25/42 |
| | | | | 114/151 |
| 5,703,377 | A | 12/1997 | Ainsworth et al. | 250/559.45 |
| 6,108,597 | A * | 8/2000 | Kirchner | E03F 7/12 |
| | | | | 180/167 |
| 7,131,344 | B2 | 11/2006 | Tarumi | 73/865.8 |
| 7,940,297 | B2 | 5/2011 | Penza et al. | 348/84 |
| 9,841,134 | B2 * | 12/2017 | Ethirajan | H04L 67/12 |
| 10,216,865 | B1 * | 2/2019 | Theobald | G06F 30/00 |
| 2007/0156286 | A1 * | 7/2007 | Yamauchi | G05D 1/0038 |
| | | | | 700/245 |
| 2009/0315725 | A1 * | 12/2009 | Hollander | H04B 1/034 |
| | | | | 340/584 |
| 2010/0180672 | A1 | 7/2010 | Zollinger | 73/61.63 |
| 2010/0295927 | A1 * | 11/2010 | Turner | H04N 13/0025 |
| | | | | 348/50 |
| 2011/0091002 | A1 | 4/2011 | Kurosawa et al. | 376/249 |
| 2012/0257704 | A1 * | 10/2012 | Asada | G21C 17/013 |
| | | | | 376/249 |
| 2012/0282826 | A1 * | 11/2012 | Asada | B63H 11/04 |
| | | | | 440/39 |
| 2013/0033594 | A1 | 2/2013 | Smith et al. | 348/83 |
| 2013/0269585 | A1 | 10/2013 | Kim et al. | |
| 2013/0291782 | A1 * | 11/2013 | Asada | B63G 8/16 |
| | | | | 114/330 |

FOREIGN PATENT DOCUMENTS

| | | | | |
|---|---|---|---|---|
| JP | 8-240689 | A | 9/1996 | G21C 17/003 |
| JP | 9-159614 | A | 6/1997 | G01N 21/88 |
| JP | 11-188327 | A | 7/1999 | B08B 9/08 |
| JP | 2000046742 | A | 2/2000 | C12C 13/00 |
| JP | 2008261807 | A | 10/2008 | G21C 17/003 |
| JP | 2009109353 | A | 5/2009 | G01N 21/84 |
| JP | 2013040927 | | 2/2013 | G01N 21/954 |
| KR | 1020100110188 | A | 10/2010 | |
| KR | 20120068330 | A | 6/2012 | |
| KR | 20120090578 | A | 8/2012 | |
| WO | WO 2004058565 | A1 * | 7/2004 | B63H 5/14 |
| WO | WO 2006/078873 | A2 | 7/2006 | |
| WO | WO 2009/029216 | A1 | 3/2009 | A61B 18/18 |
| WO | 2011132925 | | 10/2011 | |
| WO | 2012087033 | A1 | 6/2012 | |

OTHER PUBLICATIONS

Written Opinion mailed May 19, 2014 in corresponding application No. PCT/US2014/012920.
Extended European Search Report mailed Dec. 16, 2013 in corresponding application No. 13153721.9.
Response to European Extended Search Report as filed Jan. 21, 2015.
First Office Action, Chinese Application No. 2014800130450, completed Aug. 2, 2016, (13 pages, English Translation Provided).
Second Office Action, Chinese Application No. 2014800130450, completed Jun. 2, 2017, (16 pages, English Translation Provided).
European Patent Office, Communication pursuant to Article 94(3) EPC dated Sep. 17, 2018 cited in counterpart EP Application No. 13153721.9 (7 pages).

* cited by examiner

DEVICE AND METHOD FOR TRANSFORMER IN-SITU INSPECTION

TECHNICAL FIELD

Generally, the present invention is directed to transformer inspection systems. Specifically, the present invention is directed to a remotely controlled inspection device inserted into a liquid-filled high-voltage transformer. More particularly, the present invention is directed to a remotely controlled inspection device used with a virtual transfiguration of the transformer to assist in correlating collected data from the inspection device with internal components of the transformer.

BACKGROUND ART

Liquid-filled power transformers are one of the key components in power transformation and distribution. The liquid is used to cool the internal components of the transformer during its operation. As is well understood, the large liquid-filled power transformers are extremely heavy and difficult to transport and replace. They have a limited life span and necessary maintenance and repair are needed periodically.

While non-invasive techniques are now used to identify potential problems that the transformer may have; the common way to directly observe the windings, cables, supports and connectors inside a transformer tank is to drain the liquid from the transformer tank and send in a person through a manhole or open the transformer tank by cutting a top plate from the tank. Therefore, there is a need in the art for a device and related method for in-situ inspection of a transformer.

SUMMARY OF THE INVENTION

In light of the foregoing, it is a first aspect of the present invention to provide a device and method for transformer in-situ inspection.

It is another aspect of the present invention to provide an inspection device for use in a fluid container having at least an opening, comprising a housing sized to fit through the opening, the housing having a plurality of fluid flow channels extending therethrough, each flow channel having at least one inlet and at least one outlet, and a pump maintained in the housing within each fluid flow channel, the pumps selectively controlled to maneuver the housing within the fluid container.

Yet another aspect of the present invention is to provide a method of in-situ inspection of a container having at least one opening to receive a fluid, comprising up-loading a virtual model of the container into a computer, inserting an inspection device into the opening of the container, generating a position indication signal by the inspection device, receiving the position signal by the sensors associated with the container and processed on the computer, and generating a virtual image of the inspection device in relation to the virtual model of the container so as to display an actual position of the inspection device within the container.

BRIEF DESCRIPTION OF THE DRAWINGS

These and other features and advantages of the present invention will become better understood with regard to the following description, appended claims, and accompanying drawings wherein:

FIGS. 8A and 8B are schematic diagrams of the inspection device according to the concepts of the present invention wherein FIG. 8A shows two pumps under one control to rotate the device in a counter-clockwise direction and wherein FIG. 8B shows two pumps under one control rotating the device in a clockwise direction; and FIGS. 9A and 9B are schematic diagrams of the inspection device according to the concepts of the present invention, wherein FIG. 9A shows the device with one pump under one control rotating in the clockwise direction and wherein FIG. 9B shows the device under one pump and one control rotating in a counter-clockwise direction.

BEST MODE FOR CARRYING OUT THE INVENTION

Figure 1:
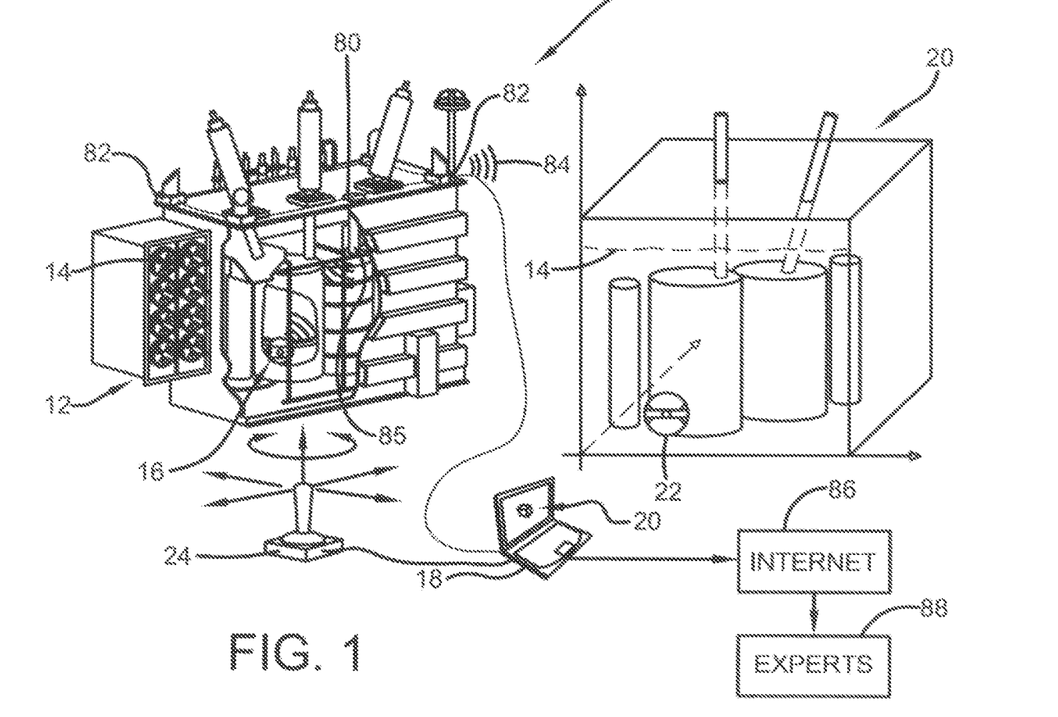
FIG. 1 is a schematic diagram of a system for transformer in-situ inspection according to the concepts of the present invention.

Referring now to the drawings, and in particular to FIG. 1, it can be seen that a system for transformer in-situ inspection is designated generally by the numeral 10. In most embodiments, the system 10 is utilized for the inspection of a transformer 12 which contains high-voltage electrical components immersed in a cooling fluid 14 such as oil. Skilled artisans will appreciate that the inspection occurs only when the transformer is off-line or not in use. As skilled artisans will appreciate, the transformer 12 utilizes the cooling fluid 14 to maintain and disburse heat generated by the internal components during operation of the transformer. Although the present embodiment is directed to systems for inspecting electrical transformers, it will be appreciated that the teachings disclosed herein are applicable to any relatively large volume sealed container which maintains a fluid. In some embodiments, the fluid used in the transformer includes dielectric properties. As skilled artisans will appreciate, the transformer 12 is maintained in a sealed configuration so as to prevent contaminants or other matter from entering. As used herein, a "sealed configuration" of the tank allows for sealed conduits and/or ducts to be associated with the transformer's tank or housing to allow for connection to the electrical components and/or monitoring devices maintained in the tank. The tank is also provided with at least one opening to allow for the filling and/or draining of the cooling fluid.

An inspection device designated generally by the numeral 16 is insertable into the transformer 12 or sealed container and is movable utilizing un-tethered, wireless remote control. A computer 18, such as a laptop computer or other appropriate computing device, is in wireless communication with the inspection device. The computer 18 may maintain a virtual transformer image 20 of the internal construction of the transformer. In most embodiments, this virtual image is a computer-aided-design (CAD) image generated in construction or design of the transformer. However, other images could be utilized. As will be described in further detail, the computer 18 utilizes the virtual transformer image 20 in conjunction with a virtual inspection device 22, which represents the actual inspection device 16, so as to monitor the positioning of the device 16 within the transformer 12. A motion control input device, such as a joystick 24 is connected to the computer 18 and allows for a technician to control movement of the device 16 inside the transformer 12 by observing the virtual inspection device 22 as it moves about the virtual transformer image 20. In other words, the technician controls movement of the device 16 based on the device's observed position within the transformer 12 as will be discussed. Other types of motion control input devices, such as used in video games, handheld computer tablets, computer touch screens or the like may be employed.

As best seen in FIGS. 2-5, the inspection device 16 includes a housing 30. The housing is of a substantially cylindrical or spherical rounded construction with no significant protrusions or extensions that might otherwise be entangled with the internal components within the transformer. The housing 30 includes an upper cover 32 having a minimally extending nub 33, a middle section 34 and a lower cover 36. The nub 33 is sized so as to allow for grasping of the inspection device from within the transformer by a tool or by a technician's hand. The nub could have other shapes, such as a loop, to facilitate easy grasping, depending on the type of tool used to grasp the device. The cover 32, the section 34 and the cover 36 are secured to one another wherein fastener apertures 40 extend through at least the covers 32 and 36 so as to receive fasteners 42 to allow for attachment to the middle section 34. In most embodiments the fasteners are maintained flush with the surface of the cover so as to minimize drag and prevent entanglement with internal components of the transformer. Extending through the housing 30 are at least two pump flow channels designated generally by the numeral 44. These channels extend vertically and horizontally through the housing and are configured so as to be sealed from the internal components of the housing 16. Each flow channel 44 provides a pair of ports 46. As shown in the drawings, numeric and alphabetic designations are provided so as to identify particular ports. For example, port 46A1 is at one end or side of the housing while the opposite end of the flow channel is designated by port 46A2. As such, the fluid maintained within the transformer can flow from one port 46A1 through and exit out port 46A2. In a similar manner, the oil may flow through port 46B1 and out port 46B2. As will be discussed, components maintained within the channels move the fluid in either direction, through the device and thus allow the device to move within the transformer tank. It should be appreciated that alternate flow channel configurations could be implemented. For example, fluid could enter the device through a single inlet and internal valves could route the fluid to all outlet ports. In another example, the vertical path could have one inlet port and two or more outlet ports.

Figure 2:
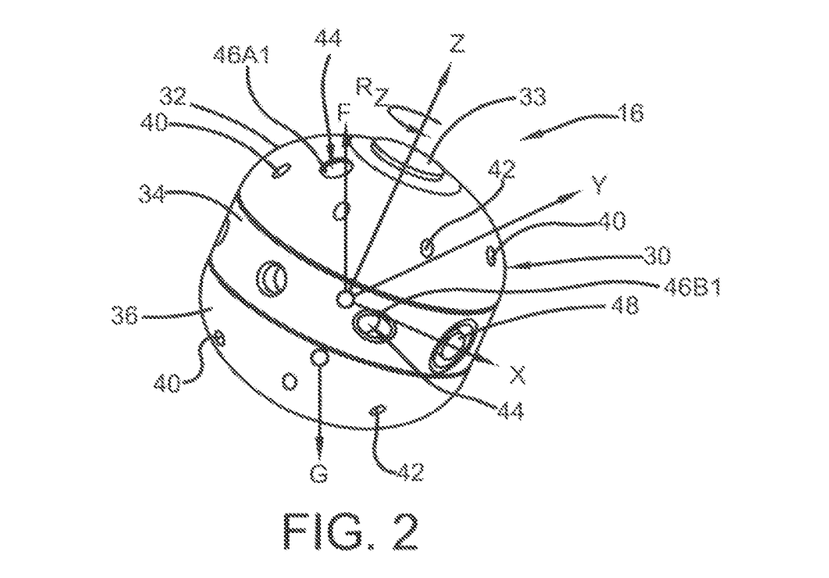
FIG. 2 is a perspective view of an inspection device used within the system according to the concepts of the present invention.
Figure 3:
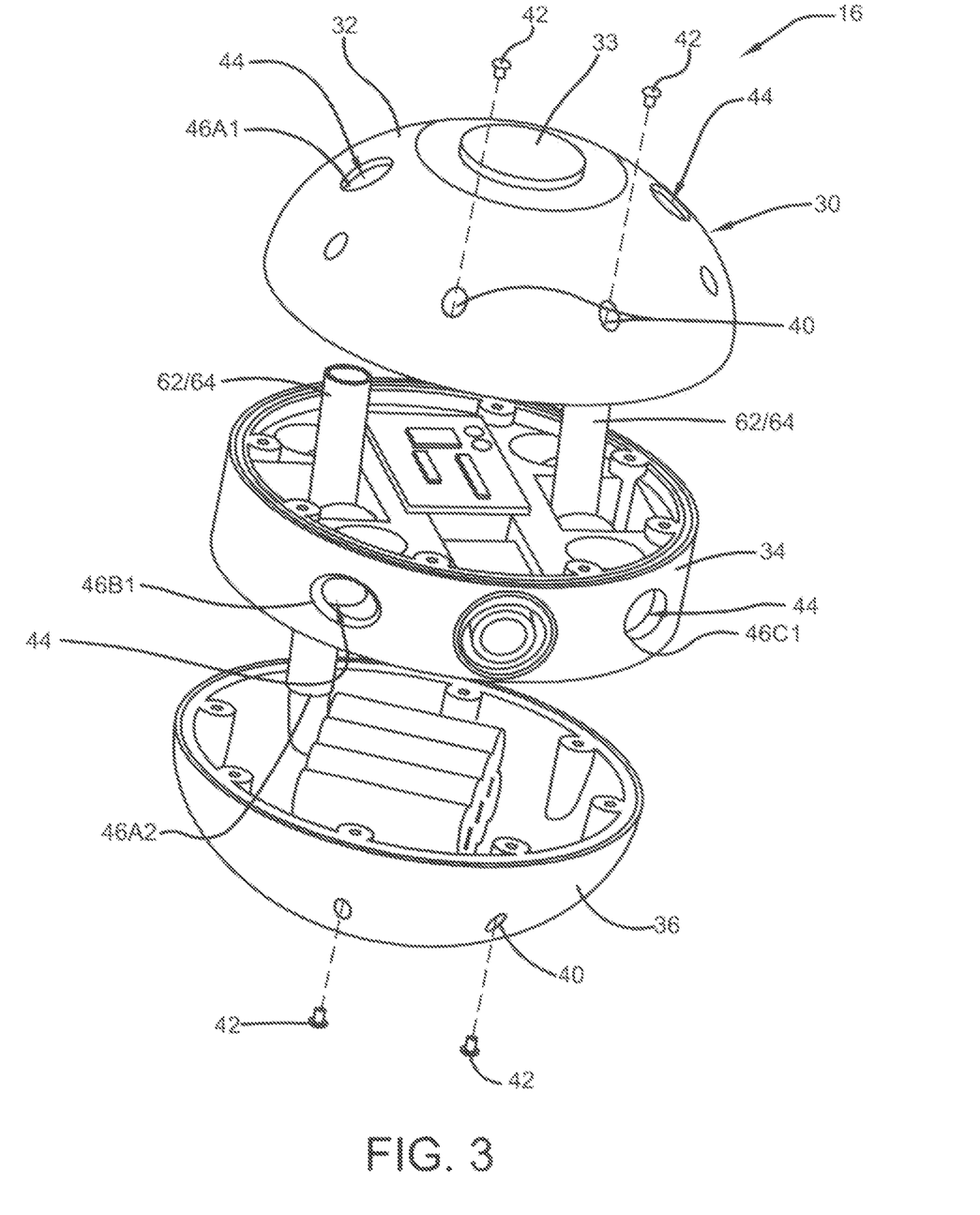
FIG. 3 is an exploded view of the inspection device used within the system according to the concepts of the present invention.
Figure 4:
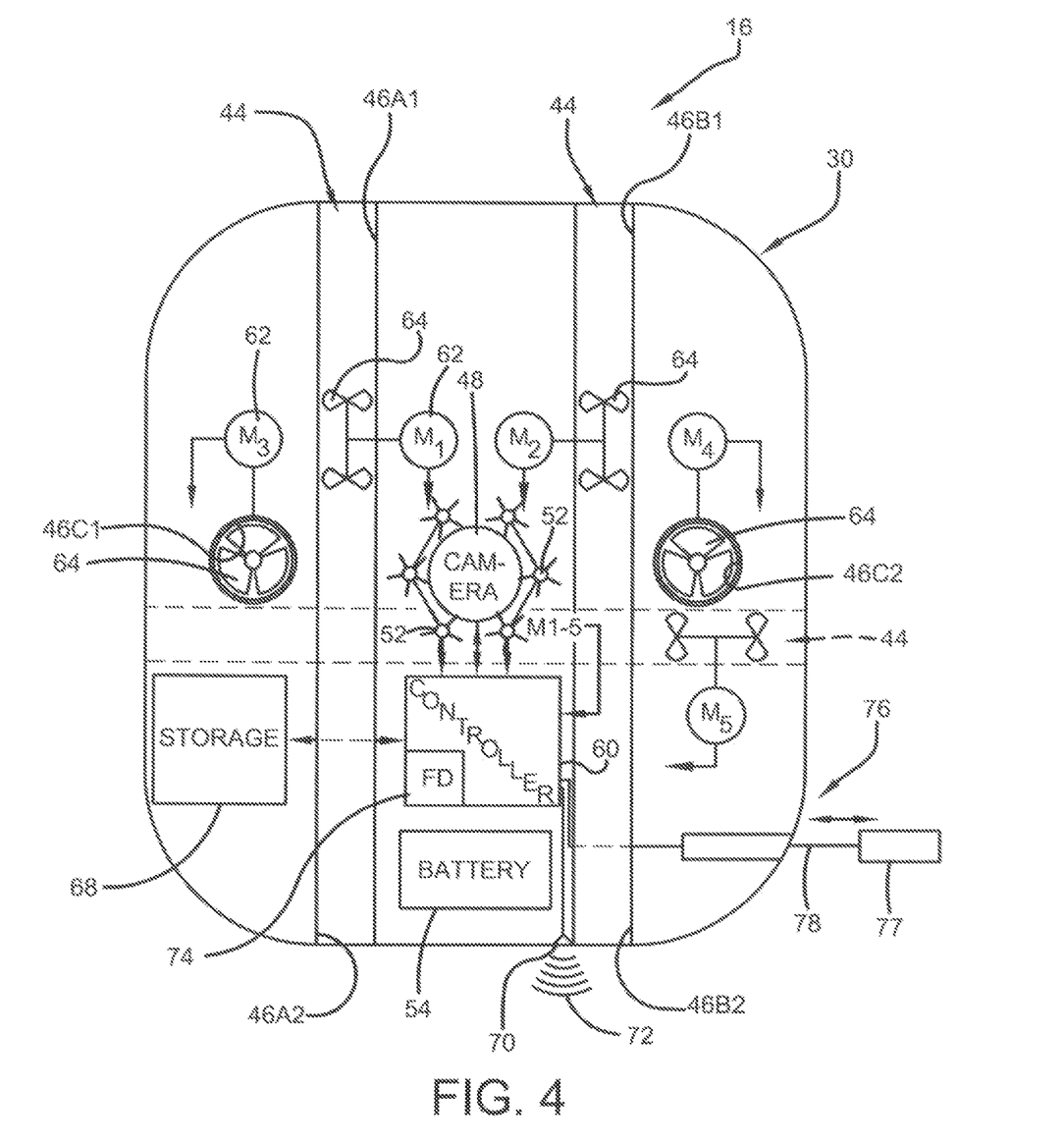
FIG. 4 is a schematic diagram of the inspection device according to the concepts of the present invention.

A sensor 48 is carried by the housing 30 and in most embodiments the sensor 48 is a camera. The camera is utilized to take visible and other wavelength images of the internal components of the transformer. These images allow for technicians to monitor and inspect various components within the transformer. In some embodiments, the housing 30 is provided with lights 52 which facilitate illumination of the area surrounding the inspection device. In some embodiments the lights 52 are light emitting diodes, but it will be appreciated that other illumination devices could be used. The illumination devices are oriented so as to illuminate the viewing area of the camera 48. In some embodiments, the user can control the intensity and wavelength of the light.

A battery pack 54 is maintained within the inspection device so as to power the internal components such as the sensor 48, the lights 52 and a controller 60. The controller 60 operates the sensor 48 and lights 52 and also controls operation of a motor 62 and a pump 64 which are used in combination with each of the provided pump flow channels 44. The controller 60 maintains the necessary hardware and software to control operation of the connected components and maintain the ability to communicate with the computer 18 and any intermediate communication devices. The controller 60 provides functionality in addition to controlling the motion of the inspection device. For example, the controller 60 can provide for a data recording function so that a high-resolution, high-speed video of the entire inspection generated by the sensor 48 can be recorded and stored onboard by the storage device 68. This can be advantageous in instances where wireless streaming of the video is interrupted or the antenna transmission of the wireless signals has a lower than desired bandwidth. Skilled artisans will appreciate that the sensor 48 may also be a thermal camera, a sonar sensor, a radar sensor, a three-dimensional vision sensor, or any combination of sensors.

Each motor 62 is reversible so as to control the flow of fluid or oil through the flow channels by the pump 64. In other words, each motor is operated independently of one another so as to control operation of the associated thruster pump 64 such that rotation of the pump in one direction causes the oil to flow through the flow channel in a specified direction and thus assist in propelling the housing 30 in a desired direction. The pump 64, which may also be referred to as a thruster pump, is shown as being a propeller type configuration, but other configurations such as a paddle-type pump could be utilized. In some embodiments, a single motor may be used to generate a flow of fluid through more than one channel. In other words, the housing could provide just one inlet and two or more outlets. Valves maintained within the housing could be used to control and re-direct the internal flow of the fluid and, as a result, control movement of the housing within the tank. By coordinating operation of the motors with the controller, and thus the oil flowing through the housing, the inspection device can traverse all areas of the transformer through which it can fit. Moreover, the device 16 is able to maintain an orientational stability while maneuvering in the tank. In other words, the device 16 is stable such that it will not move end-over-end while moving within the transformer tank.

The housing 30 provides for a center of gravity designated by the capital letter G. The device components are designed properly so that the center of gravity G is lower than the center of the buoyant force of the inspection device designated by the capital letter F. As skilled artisans will appreciate, this enables the device to be provided with stability during traversal motion.

The housing also carries a data storage device 68 which collects the data from the sensor 48 and is adequately sized to provide for storage of video or still images taken by a camera. The storage device 68 is connected to the controller 60 so as to provide for reliable transfer of the data from the sensor/camera to the storage device. It will be appreciated that in some embodiments the storage device is connected directly to the sensor and the controller receives the data directly from the storage device.

An antenna 70 is connected to the controller 60 for the purpose of transmitting data collected from the sensor and also for sending and receiving control signals for controlling the motion and/or direction of the inspection device within the transformer. The antenna generates a wireless signal 72 that can be detected by the computer or any intermediate device. A failure detection module 74 (designated as FD in FIG. 4) may be included in the controller so as to shut down the internal components within the device 16 if a system failure is detected. For example, if a low battery level is detected by the controller, the module 74 and the controller 60 can begin a controlled shutdown of the device 16 which would cause the device to float to the surface due to its positive buoyancy. In another example, a loss of connection to the remote system could also trigger a shutdown. After floating to the surface, the housing can be grasped by the nub 33.

A borescope 76 may also be carried by the housing 16. One end of the borescope provides a camera 77 or other sensor connected to a retractable fiber-optic cable 78 which is connected at its opposite end to the controller 60. When in a retracted position the camera 77 is flush with the surface of the housing 30 so as to prevent entanglement with the components inside the transformer. When inspection of hard to view items is needed, such as the windings of the transformer, the cable 78 is extended while the device is maintained in a stationary position. After images and other data are collected by the camera, the cable is retracted. As a result, the borescope 76 allows further detailed inspection of the transformer.

As noted previously, the inspection device is configured so as to easily move around the obstacles within the transformer. The housing 30 is a cylindrical-shaped with sphere ends or sphere shaped configuration and is provided with a buoyant design so as to allow the inspection device to float to the top of the oil when it is powered off purposefully or accidentally. The inspection device is configured so as to allow for the thruster pumps 64 to move the device around by selective actuation of each pump. As a result, the device has four degrees of freedom or motion: X, Y, Z and rotation around Z. As a result, by controlling the direction of the pump thrusters, the inspection device can be easily moved.

Referring back to FIG. 1, it can be seen that the transformer 12 has at least one transformer hole 80. In general operation, the oil is inserted through any number of holes located in the top of the tank. Holes 80 may also be provided at the bottom of the tank to allow for the fluid to be drained. The holes 80 are provided with the appropriate plugs or caps. Accordingly, it will be appreciated that the size of the inspection device must be such that it can fit within the hole 80. In any event, the transformer may be configured with a plurality of transmit signal receivers 82 mounted on the upper corners, edges or other areas of the transformer, or in nearby proximity to the transformer. The transmit signal receivers 82 receive the wireless signal 72 from the inspection device to determine the position of the inspection device in the transformer tank. The receivers 82 use triangulation, based on the signals 72 received or other methodology, to determine a position of the device 16 in the tank. This position information is then transmitted by a signal 84, either wired or wirelessly, to the computer 18. Additionally, the information collected by the sensor 48, such as the visual data, is transferred to the computer or other visual receiving device separately. In other words, the informational data generated by the sensor 48 is transmitted to the computer 18 through the fluid and the tank wall with the openings 80. Use of these different communication paths may be used to prevent interference between the signals; however, some embodiments may utilize the same communication path to transfer data related to positioning, data information, and control information as appropriate. Reliable communication for the device motion control and data/video streaming are critical for the transformer in-situ inspection. Utilizing the dielectric feature of the transformer coolant oil, the inspection device can be controlled by radio frequencies rather effectively. The video streaming for a Wi-Fi camera (e.g. 4.2 GHz) has been proven to be sufficient. To ensure reliable communication between the device 16 and the computer 18, a transceiver 85 may be inserted into the cooling oil tank through the service opening on the top of the transformer. In most embodiments, the transceiver 85 is used to exchange data information from the sensor 48 and the camera 77, via the controller 60 to the computer 18; and motion control or maneuvering signals from the joystick 24 via the computer 18 to the controller 60 so as to operate the motors 62 and thrusters 64. The signal 84, transmitted by the receiver 82 is used by the computer 18 to provide a separate confirmation to the device's position within the tank.

The computer 18 receives the position signals 84 and information signals 72 and in conjunction with the virtual image 20 correlates the received signals to the virtual image so as to allow a technician to monitor and control movement of the inspection device. This allows the technician to inspect the internal components of the transformer and pay particular attention to certain areas within the transformer if needed. By utilizing a virtual image of the internal features of the transformer and the position of the inspection device with respect to those virtual features, the image obtained can be matched with the corresponding site inside the actual transformer tank. Based on the visual representation of the transformer image 20 and the virtual inspection device 22 in relation to the image, a technician can manipulate the joystick 24 response. The computer 18 receives the movement signals from the joystick and transmits those wirelessly to the antenna 72, whereupon the controller 60 implements internally maintained subroutines to control the pump thrusters to generate the desired movement. This movement is monitored in realtime by the technician who can re-adjust the position of the device 16 as appropriate.

In some embodiments the computer 18 can be connected to a network 86, such as the internet, so as to allow for the images or sensor data to be transferred to experts, who may be remotely located, designated by the block 88 so that their input can be provided to the technician so as to determine the nature and extent of the condition within the transformer and then provide corrective action as needed. In some embodiments, control of the device can also be transferred to an expert, who may be remotely located. In such embodiments, the expert would have another computer that can send control signals via a network to the local computer 18 that in turn sends signals to control the device 16 as described above.

Figure 5:
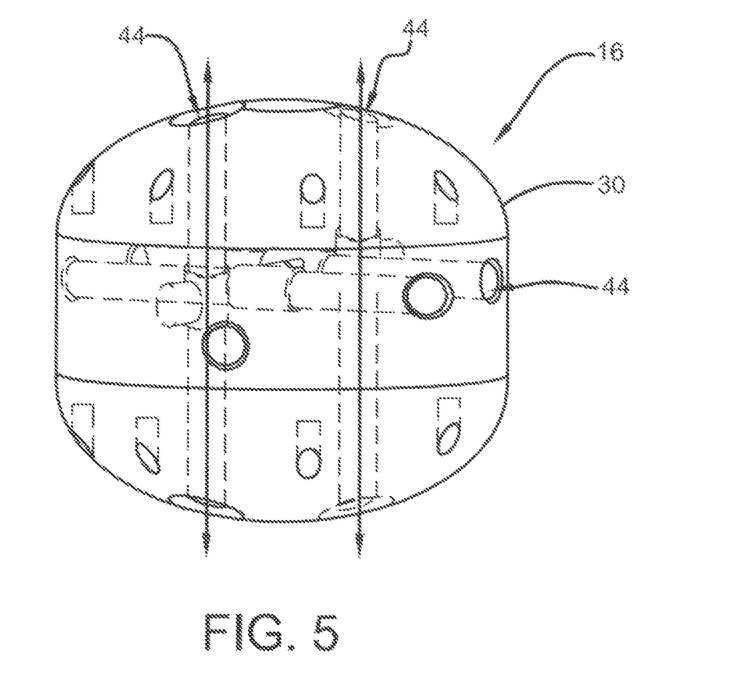
FIG. 5 is a schematic diagram of the inspection device according to the concepts of the present invention where two pumps under one control move the device in the Z direction.

Referring now to FIGS. 5-9, it can be seen that control of the motors and pump thrusters and their direction of fluid flow through the channels can control the motion of the inspection device within a fluid. For example, FIG. 5 shows the utilization of two pumps under one control so as to move the device in a Z direction. To drive along the Z axis and to remain a stable depth, the Z axis thrusters have to run continuously. The Z thruster action can be controlled either manually by the operator or automatically by the controller.

Figure 6:
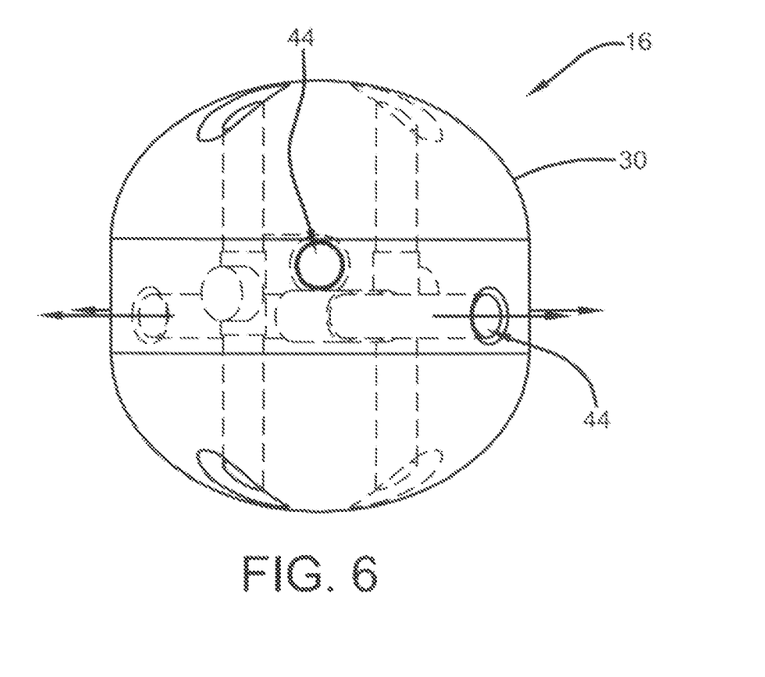
FIG. 6 is a schematic diagram of the inspection device according to the concepts of the present invention where two pumps under two controls move the device in the X direction.
Figure 7:
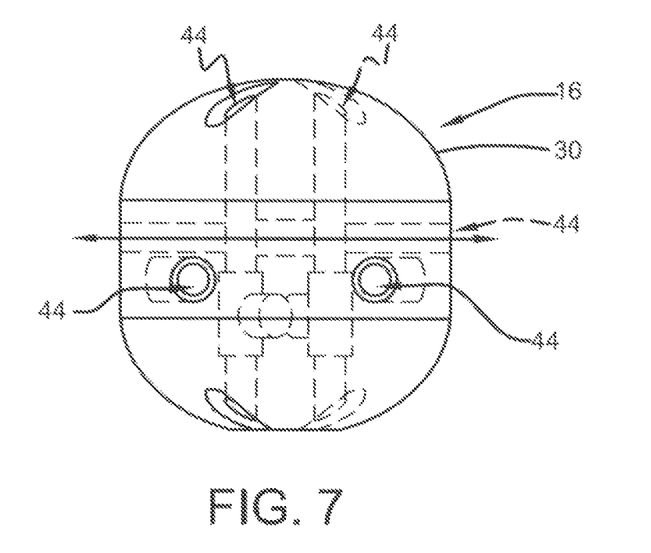
FIG. 7 is a schematic diagram of the inspection device according to the concepts of the present invention where a single pump under one control moves the device in the Y direction.

As used herein, the terminology "one control" refers to operating two pumps to operate in conjunction with one another so that the fluid flow is uniformly in one direction or the other. In FIG. 6 it can be seen that an X direction can be obtained by utilizing two pumps under two controls so as to allow for movement in an X direction. As used herein, operation of "two pumps under two controls" means that the controller operates the pumps separately from one another. In FIG. 7 it can be seen that the device is movable along the Y direction wherein one pump is utilized under one control. It will be appreciated that FIG. 7 is a side view of FIG. 6 and at a slightly different elevation with respect to the X directional flow channels.

As mentioned above, other embodiments could use different combinations of channels. For example, the three or four channels could exist in the Z direction. Also, other embodiments could have one inlet port and two outlet ports for a channel, or vice versa, or even use a different number of inlets and outlets. The number of pumps could also vary. For example, one pump could be used to control the flow of fluid from one inlet port which is then output through four outlet ports.

Figure 8A:
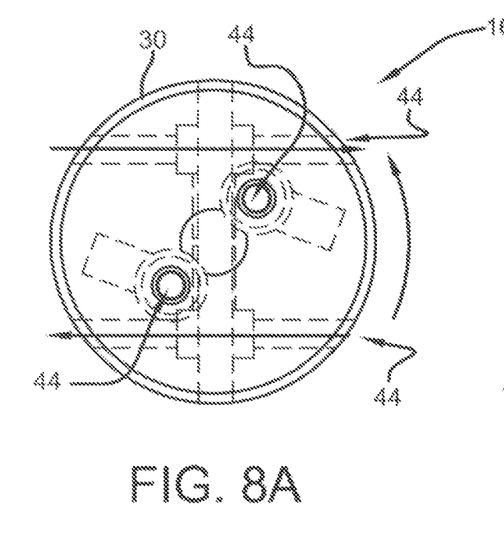
Figure 8B:
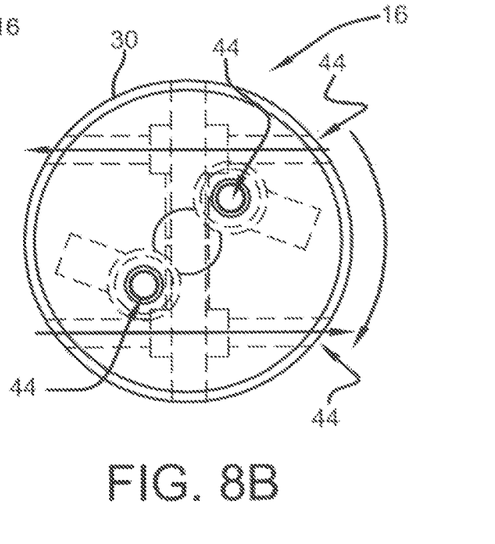
Figure 9A:
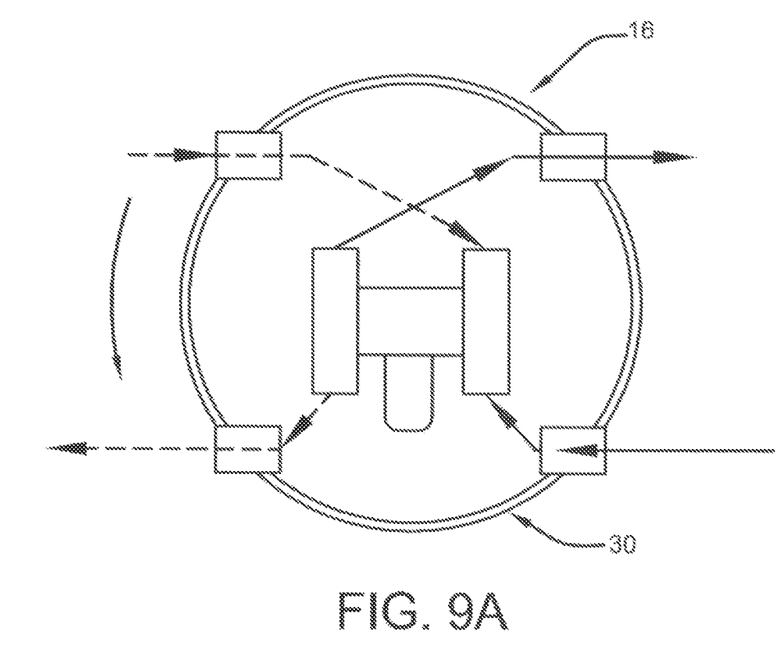
Figure 9B:
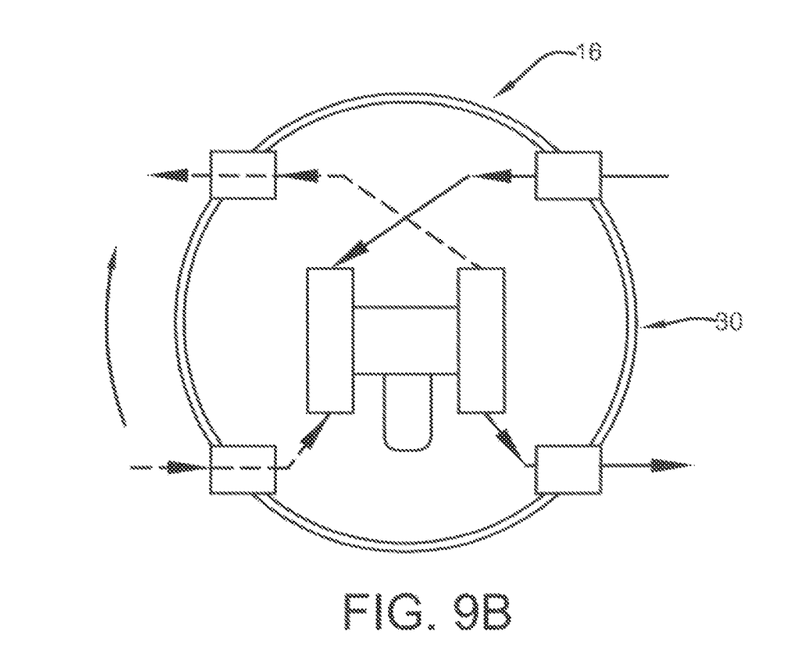

In FIGS. 8A and 8B it can be seen that two pumps under one control allow for rotation of the inspection device. In FIG. 8A, by directing the fluid flow in one direction through one channel and an opposite direction in another channel, counter-clockwise rotation can be obtained. By reversing the flows in both channels, clockwise rotation can be obtained as seen in FIG. 8B. In another variation, FIGS. 9A and 9B show rotation of the inspection device utilizing one pump under one control wherein the flow is directed from one side of the device into the device and then back out the same side. A corresponding flow is provided by the opposite side of the device so as to provide for rotation about the Z axis. Reversing the flow would provide for a corresponding reversal of the device's rotation along the Z axis.

The inspection robot/device designed for examination of transformer internals will provide the following features and advantages. First, the device allows for visual and other inspection without draining transformer oil. This is accomplished by being able to drive the device in the oil and perform visual or other inspection through the oil. The device is constructed to be resistant to an oil environment and is properly sealed. Additionally, the device is small enough to be put inside a transformer tank using existing service holes, e.g. those used for filling the transformer oil. As a result, it is not needed to unseal the transformer tank top completely. Another advantage is that the device can be controlled from the outside of the transformer using a joystick and computing device which may also be used for presenting visual data from the sensor(s). As a transformer has no ambient light, the sensor 48 utilizes a supporting light source carried by the robot. Various wavelengths of light may be used (visible and/or non-visible light) for detailed inspection of the transformer components inside. A remotely controlled arm that guides a thin fiber-optic camera head inside the transformer winding block may also be used. Still another advantage of the device 16 is that all materials employed in the device's construction are oil compatible. This is to avoid any type of contamination introduced by the device, in case the transformer directly returns to operation after the robot inspection without oil treatment.

Thus, it can be seen that the objects of the invention have been satisfied by the structure and its method for use presented above. While in accordance with the Patent Statutes, only the best mode and preferred embodiment has been presented and described in detail, it is to be understood that the invention is not limited thereto or thereby. Accordingly, for an appreciation of the true scope and breadth of the invention, reference should be made to the following claims.

What is claimed is:

1. An inspection device for use in a fluid container having at least an opening, comprising:
   a housing sized to fit through the opening, said housing having a plurality of linear fluid flow channels extending therethrough, each said flow channel having at least one inlet and at least one outlet opposite the at least one inlet and forming a through-hole therebetween within and extending through the housing, the plurality of fluid flow channels comprising at least one horizontal flow channel and at least one vertical flow channel substantially perpendicular to the horizontal flow channel; and
   a plurality of pumps, at least one pump of the plurality of pumps disposed entirely within each said fluid flow channel, said pumps configured to be selectively controlled to maneuver said housing within the fluid container with at least two degrees of translational motion, the housing further configured to be submerged in oil within the container, the plurality of pumps disposed entirely within the respective through-holes of the respective fluid flow channels and further configured to be selectively controlled to maneuver the housing within the oil.

2. The inspection device according to claim 1, wherein said housing has positive buoyancy.

3. The inspection device according to claim 1, wherein said housing maintains a center of gravity in a lower half so as to provide orientational stability while maneuvering in the fluid container.

4. The inspection device according to claim 1, wherein the pumps are further configured to rotate the housing within the fluid container about a vertical axis substantially parallel to the at least one vertical flow channel.

5. The inspection device according to claim 1, further comprising an antenna configured to generate a wireless signal from a position of the housing within the fluid container to communicate with at least one transmit signal receiver mounted on or near the fluid container.

6. The inspection device of claim 5, wherein the wireless signal comprises:
   a wireless position signal transmitted over a first communication path, the wireless position signal comprising position data; and
   a wireless information signal transmitted over a second communication path, the wireless information signal comprising sensor data generated by at least one sensor of the inspection device.

7. The inspection device of claim 5, the antenna further configured to receive a wireless movement signal to maneuver the housing.

8. The inspection device of claim 1, wherein the plurality of fluid flow channels and the plurality of pumps are configured to independently generate translational motion of the housing in a horizontal X direction and a vertical Z direction, and to generate a rotation about a vertical Z axis.

9. The inspection device of claim 8, wherein the plurality of fluid flow channels and the plurality of pumps are further configured to independently generate translational motion of the housing in a horizontal Y direction substantially perpendicular to the horizontal X direction.

10. The inspection device of claim 1, wherein the plurality of fluid flow channels include at least two fluid flow channels arranged along a horizontal X direction, extending completely through the housing and spaced apart from each other horizontally, each of the at least two fluid flow channels having one of the inlets disposed on a first side of the housing and each having one of the outlets disposed on a second side of the housing opposite the first side, wherein the at least two flow channels are configured to generate translation the of housing in the horizontal X direction and generate rotation of the housing about a vertical Z axis.

11. The inspection device of claim 1, wherein at least one of the plurality of pumps is configured to be powered by a motor, wherein the motor is reversible, and wherein the motor and the at least one pump are configured to reverse a flow through a respective fluid flow channel of the plurality of fluid flow channels to maneuver the housing.

12. The inspection device of claim 1, wherein the pumps are further configured to be selectively controlled to maneuver the housing within the fluid container with at least three degrees of translational motion.

13. The inspection device of claim 1, wherein exterior surfaces of the housing and the plurality of pumps are configured to be exposed to the oil within the respective fluid flow channels and are constructed from oil-compatible materials such that operation of the inspection device within the oil does not contaminate the oil.

14. An inspection device for an oil-filled cooling fluid container of a transformer, the inspection device comprising:
   a housing sized to fit through an opening of the cooling fluid container, the housing having a plurality of fluid flow channels extending therethrough, each flow channel having at least one inlet and at least one outlet forming a through-hole therebetween within and extending through the housing, the plurality of fluid flow channels comprising at least one horizontal flow channel and at least one vertical flow channel substantially perpendicular to the horizontal flow channel; and
   a plurality of pumps, at least one pump of the plurality of pumps disposed entirely within the respective through-hole of each fluid flow channel, the pumps configured to be selectively controlled to maneuver the housing within the fluid container with at least two degrees of translational motion,
   the housing further configured to be submerged in oil within the container, the plurality of pumps further configured to be submerged in the oil within the respective through-hole of the fluid flow channels, and to be selectively controlled to maneuver the housing within the oil while the plurality of pumps are submerged in the oil.

15. The system of claim 14, wherein the plurality of fluid flow channels and the plurality of pumps are configured to independently generate translational motion of the housing in a horizontal X direction and a vertical Z direction, and to generate a rotation about a vertical Z axis.

16. The system of claim 15, wherein the plurality of fluid flow channels and the plurality of pumps are further configured to independently generate translational motion of the housing in a horizontal Y direction substantially perpendicular to the horizontal X direction.

17. The system of claim 14, wherein exterior surfaces of the housing and the plurality of pumps are constructed from oil-compatible materials such that operation of the inspection device and the plurality of pumps within the oil does not contaminate the oil.

18. The system of claim 14, the inspection device further comprising an antenna configured to generate a wireless signal from a position of the housing within the fluid container to communicate with at least one transmit signal receiver outside the housing.

19. The system of claim 18, wherein the wireless signal comprises:
   a wireless position signal transmitted over a first communication path, the wireless position signal comprising position data; and
   a wireless information signal transmitted over a second communication path, the wireless information signal comprising sensor data generated by at least one sensor of the inspection device.

\* \* \* \* \*